United States Patent [19]

Tuller et al.

[11] 4,042,550

[45] Aug. 16, 1977

[54] ENCAPSULANT COMPOSITIONS BASED ON ANHYDRIDE-HARDENED EPOXY RESINS

[75] Inventors: Harold W. Tuller, Long Valley; Ralph W. Nussbaum, West Orange, both of N.J.

[73] Assignee: Allied Chemical Corporation, Morris Township, N.J.

[21] Appl. No.: 636,189

[22] Filed: Nov. 28, 1975

[51] Int. Cl.$^2$ ............................................. C08L 91/00
[52] U.S. Cl. ............................ 260/280 P; 260/37 EP
[58] Field of Search ............................ 260/37 EP, 28

[56] References Cited

U.S. PATENT DOCUMENTS

| 3,789,038 | 1/1974 | Curtis et al. ................. 260/37 EP X |
| 3,813,379 | 5/1974 | Brouwers et al. ........... 260/37 EP X |
| 3,838,094 | 9/1974 | Sporck ............................. 260/37 EP |

OTHER PUBLICATIONS

Dow Corning: Silane Coupling Agents; 1967; pp. 1, 6, 7.

*Primary Examiner*—Lewis T. Jacobs
*Attorney, Agent, or Firm*—Roger H. Criss; Michael S. Jarosz

[57] ABSTRACT

Epoxy molding compositions useful as semiconductor encapsulants, comprising (a) an epoxide compound; (b) as hardener, a polyanhydride of a maleic monomer and at least one alkyl styrene monomer or prepolymers of the polyanhydride and said epoxide compound; (c) a catalyst; (d) about 1 to 80 percent by weight of a silica filler; (e) about 1 to 80 percent by weight of an additional filler selected from the group consisting of calcined clay, antimony trioxide, antimony tetraoxide, calcium silicate, titanium dioxide, calcium carbonate, zinc oxide, magnesium oxide and mixtures thereof; (f) about 0.05 to 2 percent by weight of a silane coupling agent; and (g) about 0.01 to 2 percent by weight of a lubricant selected from the group consisting of carnauba wax, montanic acid ester wax, polyethylene wax, polytetrafluoroethylene wax and mixtures thereof.

14 Claims, No Drawings

ENCAPSULANT COMPOSITIONS BASED ON ANHYDRIDE-HARDENED EPOXY RESINS

BACKGROUND OF THE INVENTION

1. Field of the Invention

This invention relates to molding compositions useful as encapsulants for electronic components and more particularly to epoxy resin type encapsulants.

2. Description of the Prior Art

It has been heretofore found desirable to encase electronic components in plastic compositions to provide an electrically insulative, protective and moisture resistant package. For example, semiconductor components, such as crystal chips which are provided with printed circuits bonded to lead wires, have been encapsulated with thermosetting plastic molding compositions. One such type of molding composition is based upon silicone rubber; however, encapsulants formed therefrom, while exhibiting the requisite dielectric insulation properties, are somewhat sensitive to moisture and for certain applications provide inadequate moisture resistance in terms of mechanical properties, such as linear expansion coefficient, and water vapor transmission rate.

In U.S. Pat. No. 3,789,038 issued Jan. 29, 1974 to the present inventors together with Curtis and O'Neill, there are described polyanhydride-cured epoxy molding compounds. Such compounds comprise an epoxide compound, a hardener which is either a polyanhydride reaction product of at least one alkyl styrene monomer and at least one maleic monomer or a prepolymer of such polyanhydrides, a catalyst and filler. Exemplary of such hardeners is the polyanhydride of alpha-methyl styrene and maleic anhydride (sometimes referred to as AMS/MA hardeners). Such epoxy molding compounds exhibit excellent moisture resistance in terms of water vapor transmission rate and linear coefficient of expansion, but for certain purposes their wet electrical properties are inadequate for use as semi-conductor encapsulants. For example, compared with commercial silicone-type encapsulants, AMS/MA hardened epoxies exhibit superior moisture resistance (in terms of change in linear expansion coefficient and water vapor transmission) but somewhat inferior high temperature wet electrical properties (such as dielectric constant and dissipation factor after exposure to a pressure cooker). It would be desirable if an encapsulant molding compound were provided which has excellent moisture resistant as well as wet electrical properties.

SUMMARY OF THE INVENTION

In accordance with this invention, there is provided an epoxy molding composition, useful as an encapsulant, comprising (a) an epoxide compound having at least two 1,2-epoxide groups, (b) a hardener therefor selected from the group consisting of (1) a polyanhydride having a molecular weight below about 1000 and being the reaction product of a maleic monomer and at least one alkyl styrene monomer and (2) prepolymers of said polyanhydride with said epoxide compound, (c) a catalyst to promote the curing thereof, (d) about 1 to 80 percent by weight, based on the weight of the composition, of a silica filler, (e) about 1 to 80 percent by weight, based on the weight of the composition, of an additional filler selected from the group consisting of calcined clay, antimony trioxide, antimony tetraoxide, calcium silicate, titanium dioxide, calcium carbonate, zinc oxide, magnesium oxide, and mixtures thereof, (f) about 0.05 to 2 percent by weight of a silane coupling agent, and (g) about 0.01 to 2 percent by weight of a lubricant selected from the group consisting of carnauba wax, montanic acid ester wax, polyethylene wax, polytetrafluoroethylene wax, and mixtures thereof.

It has been surprisingly found that the presence of the additional filler, silane coupling agent and lubricant improves the moisture resistance of the electrical properties to levels which are on the order of magnitude of such properties of silicone-type encapsulants.

DESCRIPTION OF THE PREFERRED EMBODIMENT

Preparation of epoxy molding compounds including components (a), (b), (c) and (d) are disclosed in the aforementioned U.S. Pat. No. 3,789,038, the disclosure of which is expressly incorporated herein. The epoxy resin components of the molding compounds contain more than one epoxide group and may be saturated or unsaturated, aliphatic, cycloaliphatic, heterocyclic, aromatic and may be substituted if desired with substituents such as chlorine, hyroxyl, ether radicals and the like. Any of the well-known epoxy resins may be employed such as those described in U.S. Pat. No. 3,789,028 and in U.S. Pat. No. 2,633,458 referred to in the former patent. Preferred epoxy resins are the epoxy novolacs and diglycidyl ethers of bisphenol A. Specific examples of the novolac type are the polyglycidyl ether of o-cresol formaldehyde novolacs and the di- and polyglycidyl ethers of phenol formaldehyde novolac. Exemplary of the latter is the diglycidyl ether of bisphenol A.

The hardener is chosen from polyanhydrides of maleic acid monomers and alkyl styrene monomers, and prepolymers of such polyanhydrides. The polyanhydrides have low softening points, e.g., 111°–156° C and molecular weights below about 1000; they may be prepared, for example, by mass polymerization, in the absence of polymerization catalyst, utilizing a molar ratio of maleic monomer to alkyl styrene monomer of greater than 1 to 1, as disclosed in the aforementioned U.S. Pat. No. 3,789,038. The alkyl styrene monomers may be represented by the formula

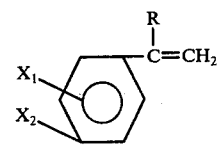

wherein R is hydrogen or alkyl containing 1 to 4 carbon atoms, with the proviso that when $X_1$ and $X_2$ are hydrogen, R is alkyl; $X_1$ and $X_2$ are hydrogen; halogen such as chloro, bromo, and iodo; alkoxy, alkyl and haloalkyl wherein the alkyl groups contain from 1 to 4 carbon atoms; acetyl; monocyclic aryl such as phenyl, tolyl and xylyl; aralkyl such as benzyl and phenethyl; or $X_1$ and $X_2$ together with the benzene nucleus may form a fused ring. Examples of such alkyl styrenes include alpha-methyl styrene; ispropyl styrene, vinyl toluene, tert. butyl styrene, vinyl xylene, 2,4-dimethyl styrene, 2-methyl-4-chlorostyrene, vinyl naphthalene, 2-methyl-2-benzyl styrene, and mixtures thereof. Alpha-methyl styrene is the most preferred alkyl styrene monomer.

The maleic monomers are in general compounds which have one carboxyl group attached to each carbon atom of an olefinic group, with the remaining valences of each doulbe bonded carbon being satisfied by organic or inorganic groupings which are inert in the principal copolymerization reaction. Such compounds are illustrated by the following formula:

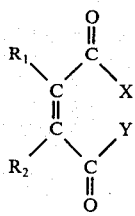

wherein $R_1$ and $R_2$ can be hydrogen; halogen such as chloro, bromo and iodo; aryl such as phenyl, xylyl and tolyl; aralkyl such as benzyl and phenethyl; alkyl groups containing 1 to 10 carbon atoms; cycloalkyl such as cyclopentyl and cyclohexyl; X and Y can be hydroxyl or X and Y together is oxygen. Examples of such compounds include maleic anhydride, methyl maleic anhydride and materials which rearrange thereto such as itaconic anhydride; propyl maleic anhydride; 1,2,-diethyl maleic anhydride; phenyl maleic anhydride; chloromaleic anhydride and maleic acid. Especially preferred is maleic anhydride.

The mole ratio of maleic monomer to alkyl styrene monomer is greater than 1 to 1 and preferably is in the range of 1.1 to 2.0 moles maleic monomer per mole of alkyl styrene monomer.

As stated above, prepolymers of the polyanhydride may alternately be employed. Such prepolymers may be prepared by adding the epoxy resin to the polyanhydride hardener product while it is still in the reaction vessel or alternatively the polyanhydride may be removed from the reaction still and added to the hot epoxy resin. These polyanhydrides have good stability and range from viscous liquids to materials which exhibit Ring and Ball softening points below 100° C., generally within the range of about 40° to 95° C. Various low equivalent weight epoxy resins can be reacted with the polyanhydrides to form the prepolymers. These include glycidyl polyethers of polyhydric alcohols and polyhydric phenols, such as diglycidyl ethers of bisphenol A, polyglycidyl ethers of phenol-formaldehyde novolacs and cresol-formaldehyde novolacs, cycloaliphatic epoxy resins and the like. In general, the epoxy resins have an epoxy equivalent weight (epoxide equivalent) of about 75 to 500. The prepolymers are prepared by adding from about 0.1 to 1.3 equivalents of epoxy per anhydride equivalent weight.

A variety of catalysts may be employed to promote the curing of the present compositions. Such catalysts include basic and acidic catalysts such as the metal halide Lewis acids, e.g., boron trifluoride, stannic chloride, zinc chloride and the like; the amines, e.g., alpha-methyl benzyl-dimethylamine, dimethylethylamine, dimethylaminoethylphenol, 2,4,6-tris(dimethylaminoethyl)phenol triethylamine and the like. The catalysts are employed in conventional amounts such as from about 0.1 to 5.0 percent by weight of the combined weight of epoxy and hardener.

The silica filler employed herein may be of the fused or crystalline type and combinations of two or more of such fillers are preferred for certain purposes. In general, an all fused type silica filler system is especially advantageous where low linear coefficient of expansion of the final product is especially important, whereas an all crystalline type silica filler is especially important for high thermal conductivity and high mold shrinkage.

Examples of fused type silica filler include GP-7I silica available from Glass Rock Products; examples of crystalline type silica include Novacite 1250 silica available from Malvern Minerals and Silica 219 available from Pennsylvania Glass and Sand.

The amount of silica filler employed may range from about 1 to 80 percent weight based on the weight of the molding compound, and preferably ranges from about 55 to 75 percent by weight on such basis. If mixtures of fused and crystalline silica fillers are employed, the amounts employed of the respective components may vary widely. Preferably, the weight ratio of crystalline to fused silica may range from about 0.5 - 3.0 to 1. The silica filler is compatible with the epoxy resin-hardener system and provides excellent physical, electrical and molding properties.

It has also been found desirable to predry the silica filler in certain instances. For example, the filler may be dried in a forced air circulating oven at about 200° to 300° F. for about 4 to 8 hours. It is believed that such predrying provides additional improvement in wet electrical properties.

As described above, it has been found that the presence of certain additional fillers to the molding compounds improve the wet electrical properties. These fillers are selected from the group consisting of calcined clay, antimony trioxide, antimony tetraoxide, calcium silicate, titanium dioxide, calcium carbonate, zinc oxide, magnesium oxide, and mixtures thereof. Mixtures of calcined clay and antimony trioxide are especially preferred. Unexpectedly, it has been found that other common fillers do not enhance or in fact decrease the wet electrical properties of the molding compounds; examples of such fillers include aluminum oxide, barium sulfate and calcium oxide. The amount of the additional filler that is employed herein ranges from about 1 to 80 percent by weight, preferably about 10 to 20 percent by weight, based on the weight of the composition.

Preferably, the combined amount of the silica and additional filler is at least 50 percent, and more preferably at least 70 percent, by weight based upon the weight of the composition.

It has also been found that silane coupling agents promote improved wet electrical properties of the compositions. The silane coupling agents may be characterized by the formula R'Si(OR)$_3$, wherein R' represents an organo-functional group such as amino, mercapto, vinyl, epoxy or methacryloxy, and OR represents a hydrolyzable alkoxy group attached to the silicon. These silane coupling agents are preferably selected from the group consisting of gamma-glycidoxypropyltrimethoxysilane, vinyl-tris(beta-methoxyethoxy)silane, gamma-aminopropyltriethoxysilane, and mixtures thereof. These are commercially available from Union Carbide under the designations A-187, A-172 and A-1100, respectively. The amount of the silane coupling agent employed in the compositions of this invention may vary from about to 0.05 to 2 percent by weight based on the total weight of the composition, and preferably ranges from about 0.2 to 0.5 percent by weight.

An additional additive which has been found to be effective in providing epoxy molding encapsulants of improved wet electrical properties is a certain class of lubricants. These lubricants are selected from the group consisting of carnauba wax, montanic acid ester wax, polyethylene wax, polytetrafluoroethylene wax and mixtures thereof. Carnauba wax is a vegetable wax.

Montanic acid ester wax is available from Hoechst as E wax. Polyethylene was is a relatively low molecular weight ethylene polymer. Polytetrafluoroethylene wax is a relatively low molecular weight tetrafluoroethylene polymer and is available from Allied Chemical as Polymist F-5A. These waxes are present in the composition in amounts ranging from about 0.01 to 2 percent by weight based on the total weight of the composition, and preferably range from about 0.2 to 1 percent by weight. Additional lubricants may be employed, such as glycerol monostearate, calcium, zinc and other metallic stearates, but are not required for the present purposes.

Other conventional additives may be present in the epoxy molding compositions of this invention. Among such additives there may be mentioned pigments, dyes, glass fiber and other reinforcing agents, and the like.

The molding compositions of the present invention may be prepared by any conventional technique. For example, the ingredients may be finely ground, dry blended and then densified on a hot differential roll mill, followed by granulation. These compositions may be molded into various articles by application of the requisite temperature and pressure. For example, molding conditions for an encapsulated semiconductor may range from 300 to 400° F., preferably 350° to 375° F., 400 to 1500 psi, preferably 800 to 1000 psi, for a time ranging from 30 to 120 seconds, preferably 60 to 90 seconds. Any suitable molding apparatus may be employed, such as a transfer press equipped with a multi-cavity mold.

In another aspect of this invention, flame retardants may be added to the epoxy molding compositions to render such compositions non-flammable. Preferably, the flame retardants are chosen so as to provide a self-extinguishing, non-dripping composition as measured by the vertical burning test of Underwriters Laboratory Bulletin 94; such compositions are designated 94V-O. It has been found that combinations of an organic halide compound and a metal-containing compound (where the metal is antimony, aluminum, phosphorus, arsenic or bismuth) are especially effective to provide 94V-O rated compositions. Preferably, the halide is a chloride or bromide and the metal-containing compound is an oxide or hydrated oxide.

Exemplary of the organic halides which may be employed herein are halogenated phthalic anhydrides, such as tetrabromo- and tetrachlorophthalic anhydride and the like; halogenated diphenyl ethers, sulfides, sulfur dioxides, methylenes and phosphonates, such as decabromodiphenyl ether, tetrachlorodiphenyl sulfide, 3,5-dichloro-3',5'-dibromodiphenyl sulfoxide, 2,4-dichloro-3',4',5'-tribromodiphenyl methane and the like; halogenated biphenyls such as hexachlorobiphenyl, hexabromobiphenyl and the like; halogenated bisphenol A and derivatives of bisphenol A, such as tetrabromobisphenol A, 3,5-dichloro-3',5'-dibromo-2,2-bis-(4,4'-diacetoxyphenyl)propane and the like; halogenated epoxy resins such as brominated diglycidyl ether of bisphenol A and the like; polyhalogenated cyclopentadienes and derivatives thereof, such as decachlorocyclopentadiene, 2,4-dichloro-phenyl pentachlorocyclopentadiene, the Diels-Alder adduct of hexachlorocyclopentadiene with 1,7-octadiene and the like; aliphatic halogenated compounds such as dibromoneopentyl glycol and the like, etc. Especially preferred organic halides are tetrabromophthalic anhydride, tetrachlorophthalic anhydride, decabromodiphenyl ether, dibromopentyl glycol, decachlorocyclopentadiene and brominated diglycidyl ether of bisphenol A. Preferred of the metal containing compounds are antimony trioxide and hydrated alumina.

The ratio of the halogenated to metal-containing compounds can vary widely; preferably, the weight ratio of elemental halogen to elemental metal ranges from about 0.1 – 3 to 1. The total amount of flame retardants added may also vary widely and are employed in effective amounts to provide the requisite flame resistance. This total may range, for example, from about 0.5 to 20 percent by weight, based on the total weight of the composition. If antimony trioxide is employed as the additional filler, it can likewise serve as a component of the preferred flame retardant system. The use of halogenated epoxies may be preferred in order to reduce the level of any other epoxide compound.

It has been found that the preferred flame retardant systems not only provide the requisite flame- and drip-resistance, but do so without sacrificing the physical properties of the compositions, including the wet electrical properties.

The flame retardants may be incorporated into the compositions in any suitable manner. For example, they may be blended in separately or together before, during or after the addition of other components. Preferably, they are dry blended with the remaining components, epoxy resin and hardener.

The following non-limiting examples further illustrate the present invention. All parts are by weight unless otherwise indicated.

EXAMPLES 1 – 15

The purpose of these Examples is to demonstrate the effect of various fillers on the wet electrical properties of epoxy molding compositions. These compositions were prepared by initially pregrinding to a fine particle size, dry blending at room temperature, densifying on a hot differential roll and granulating. Preform pills measuring about 1 ½ inches in diameter by ¾ inch thick were prepared and dielectrically preheated to 200° F. The performs were then molded in a transfer press at 1000 psi and 350° F. for 2 minutes into test discs measuring 2 inches in diameter by ⅛ inch thick. The discs were post-cured at 200° C. for 8 hours and then subjected to a pressure pot (described below) following which they were cooled to room temperature and tested for various properties.

The following additional fillers were employed in combination with fused or crystalline silica filler (not predried): calcined clay, calcium carbonate, antimony oxide, calcium silicate, titanium dioxide, barium sulfate, calcined alumina and hydrated alumina. The wet electrical properties of the disc formed from the various compositions were tested by pre-exposing them to household steam pressure cooker (15 psig) for 16 hours. The dielectric constants and dissipation factors were measured at 60 cycles using a General Radio 1621 capacitance bridge. The percent change of the multiple of the dielectric constant times the dissipation factor (DK × DF) from the multiple obtained at dry conditions was determined for each composition with parts made from freshly prepared granular molding powder and with parts made from molding powder that was at least ten days old. The results are reported in Tables I and II.

TABLE I

| FORMULATION | 1 (Control) | 2 (Control) | Examples 1-7<br>3 (Control) | 4 | 5 | 6 | 7 |
|---|---|---|---|---|---|---|---|
| AMS/MA hardener[1] | 11.0 | 11.0 | 9.0 | 9.0 | 9.0 | 11.0 | 10.0 |
| Novolac epoxy[2] | 16.0 | 16.0 | 12.4 | 12.4 | 12.4 | 16.0 | |
| Novolac epoxy[3] | | | | | | | 15.0 |
| Brominated epoxy[4] | | | 3.6 | 3.6 | 3.6 | | |
| Fused silica[5] | | 68.0 | 68.0 | 56.0 | 48.0 | | 61.0 |
| Crystalline silica[6] | 68.0 | | | | | 35.0 | |
| Calcined clay | | | | 12.0 | 20.0 | | |
| Calcium carbonate | | | | | | 33.0 | |
| Antimony oxide | | | | | | | 7.0 |
| Others[7] | 5.0 | 5.0 | 5.0 | 5.0 | 5.0 | 5.0 | 5.0 |
| WET ELECTRICALS | | | | | | | |
| (DK/DF, 60 cycles) | | | | | | | |
| Dry, 25° C. | 4.19/.006 | 3.99/.004 | 3.78/.0038 | 3.89/.0036 | 3.98/.0050 | 4.99/.0035 | 3.95/.004 |
| Pressure pot, fresh | 5.43/.172 | 4.84/.088 | 4.60/.113 | 4.41/.047 | 4.38/.030 | 5.69/.0035 | 4.50/.046 |
| % change | 3,650 | 2,620 | 3,600 | 1,370 | 550 | 1,040 | 1,200 |
| Pressure pot, aged | 6.25/.256 | 5.68/.195 | 4.68/.146 | 4.39/.049 | 4.40/.026 | 5.85/.040 | 4.41/.028 |
| % change | 5,300 | 6,900 | 4,780 | 1,430 | 480 | 1,230 | 680 |

TABLE II

| FORMULATION | 8 | 9 | Examples 8-15<br>10 | 11 | 12 | 13 | 14 | 15 |
|---|---|---|---|---|---|---|---|---|
| AMS/MA hardener[1] | 10.5 | 10.5 | 9.0 | 11.0 | 9.0 | 10.5 | 11.0 | 11.0 |
| Novolac epoxy[2] | 14.5 | 14.5 | 12.4 | 16.0 | 12.4 | 14.5 | 16.0 | 16.0 |
| Brominated epoxy[4] | | | 3.6 | | 3.6 | | | |
| Fused silica[5] | 61.0 | 54.0 | 56.0 | 35.0 | 40.0 | 38.0 | 35.0 | 35.0 |
| Antimony oxide | 7.0 | 14.0 | | | | | | |
| Calcium silicate | | | 12.0 | 33.0 | | | | |
| Titanium oxide | | | | | 28.0 | | | |
| Barium sulfate | | | | | | 30.0 | | |
| Calcined alumina | | | | | | | 33.0 | |
| Hydrated alumina | | | | | | | | 33.0 |
| Others[7] | 5.0 | 5.0 | 5.0 | 5.0 | 5.0 | 5.0 | 5.0 | 5.0 |
| WET ELECTRICALS | | | | | | | | |
| (DK/DF, 60 cycles) | | | | | | | | |
| Dry, 25° C. | 3.83/.0031 | 3.93/.0039 | 3.99/.0035 | 4.70/.007 | 6.50/.0063 | 4.25/.0044 | 5.01/.0055 | 4.55/.007 |
| Pressure pot, fresh | 4.25/.023 | 4.30/.019 | 4.75/.080 | 5.50/.052 | 7.65/.063 | 4.95/.063 | 5.70/.133 | 4.99/.096 |
| % change | 720 | 440 | 2,570 | 750 | 1,080 | 1,750 | 2,650 | 1,400 |
| Pressure pot, aged | | | | 5.82/.068 | | | 6.82/.225 | 7.40/.225 |
| % change | | | | 770 | | | 5,500 | 5,150 |

Notes to Tables I and II:
1. copolymer of alpha methyl styrene and maleic anhydride, molar ratio 1.0/1.78.
2. Polyglycidyl ether of o-cresol formaldehyde novolac, eq. wt. 200–300.
3. polyglycidyl ether of phenol formaldehyde novolac, eq. wt. 174–180.
4. brominated diglycidyl ether of bisphenol A, Epirez 5163 from Celanese.
5. GP-7I.
6. Silica 219.
7. includes other fillers, amine accelerator, pigments and lubricants as follows: 2% of ½ inch fiberglass, 0.1 to 0.2% of 2,4,6-tris(dimethylaminomethyl)phenol (DMP-30), 0.2 to 0.3% carbon black and 0.4 to 0.5% of calcium stearate, carnauba wax and glycerol monostearate (GMS).

It can be seen from Tables I and II that upon exposure to an aqueous environment, the wet electrical properties were substantially adversely affected as is shown by the percentage change of DK × DF: 3,650, 2,620 and 3,600, respectively. This condition was aggravated when the compositions were stored prior to molding. On the other hand, calcined clay appears to be the best additional filler in terms of maintaining low wet DK × DF electrical properties. At 20% level (Example 5) the percent change of the fresh powder was only 550 and that of the aged powder was only 480. Barium sulfate and alumina, however, exhibited high percent changes and hence are unsuitable as additional fillers. The product of DK × DF is referred to as the Dielectric Loss Index and the actual power loss in watts in the plastic can be calculated therefrom.

EXAMPLES 16 - 22

These Examples demonstrate the effect of silane coupling agents on the wet electrical properties of epoxy molding compounds. The samples were prepared as in Example 4 except that the silane compound was mixed with the silica filler (in a weight ratio of 11.5% silane and 88.5% filler), micropulverized and added to the other ingredients. The same type of silica fillers were employed except they were dried in an oven at 300° F. for 8 hours. The results are shown in Table III.

The thermal expansion of the molded parts was determined by heating a sample measuring about ¼ × 174 × .006 inch thick in helium at 5° C per minute and measuring the expansion in the range of 25° to 250° C. with a Perkin-Elmer Model TMS-1 Thermal Mechanical Analyzer; the expansion is reported in the table under LCE (linear coefficient of expansion).

TABLE III

| FORMULATION | 16 (Control) | Examples 16-22<br>17 (Control) | 18 | 19 | 20 | 21 | 22 |
|---|---|---|---|---|---|---|---|
| AMS/MA hardener[1] | 10.5 | 10.5 | 10.5 | 10.5 | 10.5 | 10.5 | 10.5 |
| Novolac epoxy[2] | 13.0 | 13.0 | 13.0 | 13.0 | 13.0 | 13.0 | 13.0 |
| DGEBA epoxy[3] | 1.5 | 1.5 | 1.5 | 1.5 | 1.5 | 1.5 | 1.5 |
| Crystalline silica | 68.0 | | 67.8 | 67.6 | 67.6[10] | 67.6[10] | 67.3[10] |
| Fused Silica | | 68.0 | | | | | |

TABLE III-continued

| FORMULATION | Examples 16-22 | | | | | | |
|---|---|---|---|---|---|---|---|
| | 16 (Control) | 17 (Control) | 18 | 19 | 20 | 21 | 22 |
| A-187 Silane[4] | | | .2 | .32[8] | .32[9] | | |
| A-172 Silane[5] | | | | | | .32[9] | |
| A-1100 Silane[6] | | | | | | | .64[9] |
| Other[7] | 7.0 | 7.0 | 7.0 | 7.0 | 7.0 | 7.0 | 7.0 |
| MOLDING PROPERTIES, 350° F. | | | | | | | |
| EMMI Spiral, inches | 31 | 29 | 32 | 31 | 28 | 31 | 30 |
| LCE,in./in./° C × 10[-6] | | | | | | | |
| 60-110° C. | 29 | | | 29 | 29 | 29 | |
| 110-150° C. | 32 | | | 32 | 32 | 32 | |
| WET ELECTRICALS | | | | | | | |
| (DK/DF, 60 cycles) | | | | | | | |
| Dry, 25° C. | 4.21/.0036 | 3.86/.0028 | 4.25/.0035 | 4.37/.0034 | 4.23/.0032 | 4.20/.003 | 4.20/.0036 |
| Pressure pot | 4.91/.050 | 4.39/.044 | 4.80/.033 | 4.76/.031 | 4.79/.023 | 4.68/.016 | 4.62/.014 |
| % change | 1,550 | 1,650 | 950 | 890 | 700 | 500 | 390 |

Notes to Table III.
1. copolymer of alpha methyl styrene and maleic anhydride, molar ratio 1.0/1.70.
2. diglycidyl ether of phenol/formaldehyde novolac, approx. eq. wt. 185.
3. brominated diglycidyl ether of bisphenol A, approx. mol. wt. 800.
4. gamma-glycidioxypropyltrimethoxy silane.
5. vinyl tris(beta-methoxy ethoxy) silane.
6. gamma-aminopropyltriethoxysilane.
7. includes other fillers, accelerator, pigments, and lubricants as follows: 4% antimony trioxide, 2% ½ inch glass fiber, 0.12% DMP-30, 0.15% nubian black, 0.25% carbon black, 0.2% carnauba wax, 0.2% calcium stearate, 0.1% GMS.
8. blended into mix, no pretreatment.
9. heat treated onto the silica.
10. NovaKup from Malverne Minerals.

It can be seen from Table III that silane coupling agents per se are effective to reduce the percent change of DK × DF after exposure to pressure pot conditions but such agents do not significantly reduce the DK and DF of the control samples. The DK and DF of the control were lower than the control of Table I due to the predrying of the filler, as shown below in Examples 48 and 49.

EXAMPLES 23 & 29

These Examples also demonstrate the effect of silane coupling agents on wet electricals. The wet electricals were tested with moldings made from fresh molding compositions. The results are shown in Table IV.

TABLE IV

| FORMULATION | Examples 23-29 | | | | | | |
|---|---|---|---|---|---|---|---|
| | 23 (Control) | 24 | 25 | 26 | 27 | 28 | 29 |
| AMS/MA hardener | 10.5 | 10.5 | 10.5 | 10.5 | 10.5 | 10.5 | 10.5 |
| Novolac epoxy | 13.0 | 13.0 | 13.0 | 13.0 | 13.0 | 13.0 | 13.0 |
| DGEBA epoxy | 1.5 | 1.5 | 1.5 | 1.5 | 1.5 | 1.5 | 1.5 |
| A-187 Silane | | .18[2] | .18[2] | .18[2] | .18[3] | .18[4] | .18[4] |
| A-172 Silane | | | | | | | |
| Fused silica | 68.0 | 67.82 | 67.82 | 67.82 | 67.82 | 67.82 | 67.82 |
| Others[1] | 7.0 | 7.0 | 7.0 | 7.0 | 7.0 | 7.0 | 7.0 |
| MOLDING PROPERTIES, 350° F. | | | | | | | |
| EMMI Spiral, inches | 24 | 25 | 24 | | | | 25 |
| WET ELECTRICALS | | | | | | | |
| (DK/DF, 60 cycles) | | | | | | | |
| Dry, 25° C. | 3.89/.0029 | 3.89/.0029 | 3.89/.0029 | 3.89/.0029 | 3.89/.0029 | 3.89/.0029 | 3.89/.0029 |
| Pressure pot | 4.41/.045 | 4.26/.0085 | 4.22/.0082 | 4.23/.0080 | 4.23/.0080 | 4.20/.0080 | 4.25/.0080 |
| % change, fresh | 1,700 | 25 | 208 | 202 | 202 | 205 | 215 |

Notes to Table IV:
1. includes other fillers, accelerators, pigments and lubricants as in note 7, Table III.
2. blended in dry mix.
3. ball milled on silica - no heat treatment.
4. heat treated on silica prior to compounding.
5. aged for 14 days at 40% RH, 80° F.

Table IV also shows that effect on the percent change in Dk × DF by employing silane coupling agents.

EXAMPLES 30-40

The purpose of these Examples is to demonstrate the effect of lubricants on the wet electrical properties of epoxy molding compositions, using the polyanhydride copolymer of Example 4 and as the novolac epoxy a polyglycidyl ether of o-cresol formaldehyde novolac having an approximate equivalent weight of 200-230. The filler employed was crystalline silica which was not predried. The results are shown in Table V.

TABLE V

| FORMULATION | Examples 30-35 | | | | | |
|---|---|---|---|---|---|---|
| | 30 | 31 | 32 | 33 | 34 | 35 |
| AMS/MA | 10.75 | 10.75 | 10.75 | 10.75 | 10.75 | 10.75 |
| Novolac epoxy | 14.25 | 14.25 | 14.25 | 14.25 | 14.25 | 14.25 |
| Carnauba wax[1] | .45 | | | .10 | | |
| Calcium stearate | | .45 | | .20 | | |
| GMS[2] | | | .45 | .15 | | |
| Chemetron 100[3] | | | | | .45 | |
| E-wax[4] | | | | | | .45 |
| AC-A12[5] | | | | | | |
| AC-6A[5] | | | | | | |
| AC-9A[5] | | | | | | |
| AC-802A[5] | | | | | | |
| AC-812[5] | | | | | | |

TABLE V-continued

| | | | | | | |
|---|---|---|---|---|---|---|
| Crystalline Silica | 72.1 | 72.1 | 72.1 | 72.1 | 72.1 | 72.1 |
| Others[6] | 2.45 | 2.45 | 2.45 | 2.45 | 2.45 | 2.45 |
| MOLDING PROPERTIES[7] | | | | | | |
| Processability | E | E | E | E | E-G | E |
| Release, 350° F. | E | E | E | E | E | E |
| Part appearance | S | A | F | A | F | F |
| EMMI Spiral (300° F),in. | 13 | 14 | 13 | 14 | 12 | 12 |
| WEC (μ-mohs)[8] | 5.1 | 5.4 | 5.9 | 5.5 | 6.8 | 5.4 |
| WET ELECTRICALS | | | | | | |
| (DK/DF, 60 cycles) | | | | | | |
| Dry, 25° C. | 4.15/.006 | 4.15/.006 | 4.15/.006 | 4.16/.006 | 4.15/.006 | 4.15/.006 |
| Pressure pot | 6.86/.326 | BROB | BROB | 8.77/.447 | 9.11/.504 | 6.93/.504 |
| % change | 8,870 | | | 15,500 | 18,400 | 7,700 |

| FORMULATION | Examples 36–40 | | | | |
|---|---|---|---|---|---|
| | 36 | 37 | 38 | 39 | 40 |
| AMS/MA | 10.75 | 10.75 | 10.75 | 10.75 | 10.75 |
| Novolac epoxy | 14.25 | 14.25 | 14.25 | 14.25 | 14.25 |
| Carnauba wax[1] | | | | | |
| Calcium stearate | | | | | |
| GMS[2] | | | | | |
| Chemetron 100[3] | | | | | |
| E-wax[4] | | | | | |
| AC-A12[5] | .45 | | | | |
| AC-6A[5] | | .45 | | | |
| AC-9A[5] | | | .45 | | |
| AC-820A[5] | | | | .45 | |
| AC-812[5] | | | | | .45 |
| Crystalline Silica | 72.1 | 72.1 | 72.1 | 72.1 | 72.1 |
| Others[6] | 2.45 | 2.45 | 2.45 | 2.45 | 2.45 |
| MOLDING PROPERTIES[7] | | | | | |
| Processability | E | E | E | E | E |
| Release, 350° F. | E | E | E | E | E |
| Part appearance | A | F | A | F | F |
| EMMI Spiral (300° F)in. | 10 | 10 | 11 | 10 | 9 |
| WEC (μ-mohs)[8] | 5.2 | 5.4 | 5.3 | 5.4 | 5.5 |
| WET ELECTRICALS | | | | | |
| (DK/DF, 60 cycles) | | | | | |
| Dry, 25° C. | 4.14/.006 | 4.14/.006 | 4.16/.006 | 4.15/.006 | 4.15/.006 |
| Pressure pot | 7.13/.307 | 8.24/.410 | 6.94/.274 | 7.14/.387 | 7.19/.368 |
| % change | 8,650 | 13,300 | 7,500 | 11,000 | 10,500 |

Notes to Table V.
1. vegetable wax from Frank B. Ross Co.
2. glycerol monostearate.
3. Chemetron wax 100 - N,N'-ethylene-bis-stearamide.
4. ester wax based on montanic acid, from Hoescht.
5. various low molecular weight polyethylene waxes from Allied Chemical differing in molecular weight, density and particle size.
6. 2% ½ inch glass fiber, 0.3% carbon black and 0.15% DMP-30.
7. E=excellent, E-G=excellent to good; A=acceptable; F=fair; S=lubrication spots.
8. water extract conductivity - reflux of ground parts in water for 4 hours.

BROB = beyond range of bridge.

As can be seen from Table V, the lowest wet electrical properties were obtained using carnauba wax, Hoescht E-wax and AC-9A polyethylene wax as lubricants.

Examples 41–47

These Examples also demonstrate the effect of lubricants on the wet electrical properties of epoxy molding compositions, usng the polyanhydride copolymer of Example 4 and, as novolac epoxy, a polyglycidyl ether of o-cresol formaldehyde novolac having an approximate equivalent weight of 200. The fillers were fused silica and calcined clay and were oven dried at 300° F for 8 hours. The results are shown in Table VI.

TABLE VI

| FORMULATION | Examples 41–47 | | | | | | |
|---|---|---|---|---|---|---|---|
| | 41 | 42 | 43 | 44 | 45 | 46 | 47 |
| AMS/MA | 9.0 | 9.0 | 9.0 | 9.0 | 9.0 | 9.0 | 9.0 |
| Novolac epoxy | 16.0 | 16.0 | 16.0 | 16.0 | 16.0 | 16.0 | 16.0 |
| Calcium stearate | 0.2 | | | | | | |
| GMS[1] | 0.15 | | | | | | |
| Carnauba wax[2] | 0.10 | 0.3 | | | | | |
| E-wax[3] | | | 0.5 | | | | 0.1 |
| AC-9A[4] | | | | 0.5 | | | |
| Polymist F-5A[5] | | | | | 1.0 | | 0.5 |
| Graphite | | | | | | 1.0 | |
| Calcined clay | 19.5 | 19.5 | 19.5 | 19.5 | 19.5 | 19.5 | 19.5 |
| Fused silica | 52.4 | 52.5 | 52.35 | 52.35 | 51.85 | 51.85 | 52.85 |
| Others | 2.65 | 2.65 | 2.65 | 2.65 | 2.65 | 2.65 | 2.65 |
| MOLDING PROPERTIES[7] | | | | | | | |
| Processability | A | A | A | A | A | F | A |
| Release, 350° F. | A | A | A | A | A | A | A |
| Part appearance | F-G | F-G | S | F-G | F-G | F-G | F-G |
| EMMI Spiral (350° F)in. | 16 | 15 | 14 | 13 | 8 | 11 | 14 |
| WET ELECTRICALS | | | | | | | |
| (DK/DF, 60 cycles) | | | | | | | |
| Dry, 25° C. | 3.96/.0045 | 3.97/.0040 | 4.01/.0047 | 3.98/.0054 | 3.98/.0042 | 5.18/.0060 | 4.46/.0043 |

TABLE VI-continued

| FORMULATION | 41 | 42 | Examples 41-47<br>43 | 44 | 45 | 46 | 47 |
|---|---|---|---|---|---|---|---|
| Pressure pot | 4.55/.042 | 4.33/.030 | 4.49/.031 | 4.40/.022 | 5.33/.757 | 6.11/.184 | 4.46/.022 |
| % change, fresh | 970 | 625 | 675 | 450 | 22,300 | 6,100 | 455 |
| Total filler | 55.05 | 55.15 | 55.0 | 55.0 | 54.5 | 54.5 | 54.9 |

Notes to Table VI.
1. glycerol monostearate.
2. vegetable wax from Frank B. Moss Co.
3. ester wax based on montanic acid, from Hoechst.
4. polyethylene wax from Allied Chemical.
5. polytetrafluoroethylene wax from Allied Chemical.
6. 2% of ½ inch glass fiber, 0.3% carbon black, 0.2% A-187 and 0.15% DMP-30.
7. - A=acceptable; F=fair; F-G=fair to good.

As can be seen from Table VI, again the best wet electrical properties are obtained using carnauba wax, Hoechst E-wax and AC-9A polyethylene wax. The wet electrical values are in most cases lower than those of Table V due to the presence of calcined clay, silane and dried fillers.

EXAMPLES 48 – 49

These Examples demonstrate the effect on wet electrical properties of pre-drying the silica filler. The polyanhydride of Example 4 was employed and the epoxy resin was a diglycidyl ether of bisphenol A having an equivalent weight of 500. The dried filler was dried for 4 hours at 600° C. The crystalline filler of Example I was used. The results are shown in Table VII.

TABLE VII

| Formulation | As Is Filler<br>Example 48 | Pre-Dried Filler<br>Example 49 |
|---|---|---|
| AMS/MA | 7.0 | 7.0 |
| DGEBA epoxy | 20.0 | 20.0 |
| Crystalline filler | 69.8 | 69.8 |
| Other[1] | 3.2 | 3.2 |
| Wet Electricals | | |
| (DK/DF, 60 cycles) | | |
| Dry, 25° C | 4.20/.009 | 4.18/.007 |
| Pressure Pot | 6.12/.207 | 5.18/.077 |
| % Change | 3,250 | 1,320 |
| % Water Pick-up of molded parts after pressure pot | 0.70 | 0.64 |

[1]includes fillers, accelerators, pigments, lubricants, and silane as follows: 2% of ½ inch fiber glass, 0.23% of A-187 silane, 0.18% of DMP-30 accelerator, 0.3% carbon black, 0.12% carnauba wax, 0.14% calcium stearate and 0.15% GMS.

1 - includes fillers, accelerators, pigments, lubricants, and silane as follows: 21% of ½ inch fiber glass, 0.23% of A-187 silane, 0.18% of DMP-30 acelerator, 0.3% carbon black, 0.12% carnauba wax, 0.14% calcium stearate and 0.15% GMS.

Table VII demonstrates that predrying of the silane filler greatly reduces the percent change in wet electrical properties between the dry and pressure pot conditions as well as reduces the water pick-up of molded parts.

EXAMPLES 50 – 56

The Examples demonstrate the advantages obtained by the combination of select fillers and silane coupling agents to epoxy molding compositions. The polyanhydrides and silica fillers of Example IV were employed. The crystalline silica was pre-dried at 600° for 4 hours; the fused silica was not predried. The results are shown in Table VIII.

TABLE VIII

| FORMULATION | 50 | 51 | Examples 50-56<br>52 | 53 | 54 | 55 | 56 |
|---|---|---|---|---|---|---|---|
| AMS/MA | 10.5 | 10.5 | 11.0 | 9.0 | 10.0 | 10.5 | 10.5 |
| Novolac epoxy[1] | 13.0 | 13.0 | | | 15.0 | 13.0 | 13.0 |
| Novolac epoxy[2] | | | 16.0 | 12.4 | | | |
| DGEBA epoxy[3] | 1.5 | 1.5 | | 3.6 | | 1.5 | 1.5 |
| Crystalline silica | 64.5 | 50.5 | | | | | |
| Fused silica | | | 68.0 | 48.0 | 61.0 | 50.5 | 54.5 |
| Antimony oxide | | 4.0 | | | 7.0 | 4.0 | 4.5 |
| Calcined clay | | 10.0 | | 20.0 | | 10.0 | 5.5 |
| A-172 Silane[4] | 0.32[5] | 0.25[5] | | | | | |
| Others[6] | 10.1 | 10.1 | 5.0 | 5.0 | 5.0 | 10.1 | 10.1 |
| WET ELECTRICALS | | | | | | | |
| (DK/DF, 60 cycles) | | | | | | | |
| Dry, 25° C. | 4.20/.0030 | 4.22/.0035 | 3.99/.004 | 3.98/.0050 | 3.95/.004 | 3.94/.0033 | 4.57/.0032 |
| Pressure pot | 4.68/.016 | 4.64/.010 | 4.84/.088 | 4.38/.030 | 4.50/.046 | 4.38/.003 | 4.57/.060 |
| % change | 500 | 215 | 2,620 | 550 | 1,200 | 1,000 | 1,700 |

Notes to Table VIII.
1. diglycidyl ether of phenol formaldehyde novolac, approximate equivalent weight 185.
2. polyglycidyl ether of o-cresol formaldehyde novolac, approximate equivalent weight 200-300
3. brominated diglycidyl ether of bisphenol-A, approximate molecular weight 800.
4. vinyl-tris(beta-methoxyethoxy)silane, Union Carbide.
5. heat treated onto the silica filler (NovaKup, Malvern Minerals).
6. includes fiberglass, carbon black, nubian black, A-172 silane, DMP-30, calcium stearate, carnauba wax and GMS.

As can be seen from Table VIII, the silane and fillers can be combined serendipitiously. Examples 50 and 51 demonstrate the added improvement in wet electricals and Examples 52–56 show that fillers can be used in combination to achieve improved wet electricals.

EXAMPLES 57 and 58

These Examples demonstrate the effect of flame retardants on the epoxy molding compositions of this invention. In Example 57, an additional filler was not employed whereas in Example 58, 20% of calcined clay was used. The polyanhydride was a copolymer of alpha methyl styrene and maleic anhydride, molar ratio of 1.0/1.78 and the epoxy was a polyglycidyl ether of o-cresol formaldehyde novolac, approximate eq. wt.

200–300. As flame retardants, tetrachlorophthalic anhydride and antimony trioxide were used. The results are shown in Table IX, below:

TABLE IX

| FORMULATION | Example 57 (Control) | Example 58 |
|---|---|---|
| AMS/MA | 6.6 | 6.6 |
| Novolac epoxy | 14.4 | 14.4 |
| Tetrachlorophthalic anhydride | 4.0 | 4.0 |
| Antimony oxide | 2.0 | 2.0 |
| Fused silica | 67.0 | 47.0 |
| Calcined clay | | 20.0 |
| Others[1] | 6.0 | 6.0 |
| F.R. Elemental % | | |
| Chlorine | 2.0 | 2.0 |
| Antimony | 1.7 | 1.7 |
| Molding Properties | | |
| EMMI Spiral, ins. | 12 | 8.5 |
| Release | good | good |
| Wet Electricals (DK/DF, 60 cycles) | | |
| Dry, 25° C. | 3.70/.0030 | 4.00/.0038 |
| Pressure pot | 4.25/.052 | 4.30/.019 |
| % change | 1,890 | 438 |
| U.L. 94 Rating | 94 V-O | 94 V-O |

[1]includes 2% of ¼ inch fiberglass, 2.85% of Silica 219, 0.3% carbon black, 0.23% A-187 silane, 0.165% DMP-30, 0.25% carnauba wax and 0.2% calcium stearate.

1 - includes 2% of ½ inch fiberglass, 285% of Silica 219, 0.3% carbon black, 0.23% A-187 silane, 0.165% DMP-30, 0.25% carnauba wax and 0.2% calcium stearate.

The results of Table IX demonstrate that whereas the combination of tetrachlorophthalic anhydride and antimony oxide renders control Example 57 flame retardant and drip-resistant as determined by the vertical burn test of U.L. Bulletin 94, the wet electrical properties of the non-calcined clay control example were somewhat poor. On the other hand, when 20% of the fused silica is replaced by calcined clay, the wet electrical properties were improved and the composition still was rated 94-0 (the highest rating under the test).

It is to be understood that variations and modifications of the present invention may be made without departing from the scope of the invention. It is also to be understood that the scope of the invention is not to be interpreted or limited to the specific embodiment disclosed herein but only in accordance with the appended claims when read in light of the foregoing disclosure.

We claim:

1. An epoxy molding composition, suitable for use as an encapsulant having improved high temperature wet electrical properties, comprising:
   a. an epoxide compound having at least two 1,2-epoxide groups;
   b. a hardener therefor selected from the group consisting of (1) a polyanhydride having a molecular weight below about 1,000 and being the reaction product of a maleic monomer and at least one alkyl styrene monomer and (2) prepolymers of said polyanhydride with said epoxide compound;
   c. a catalyst to promote the curing thereof;
   d. about 55 to 75% by weight, based on the weight of the composition, of a silica filler;
   e. about 10 to 20% by weight, based on the weight of the composition, of an additional filler selected from the group consisting of calcined clay, antimony trioxide, antimony tetraoxide, calcium silicate, titanium dioxide, calcium carbonate, zinc oxide, magnesium oxide, or mixtures thereof;
   f. about 0.05 to 2% by weight, based on the weight of the composition, of a silane coupling agent; and
   g. about 0.01 to 2% by weight, based on the weight of the composition, of a lubricant selected from the group consisting of carnauba wax, montanic acid ester wax, polyethylene wax, polytetrafluoroethylene wax and mixtures thereof, said composition, when heat cured, exhibiting improved high temperature wet electrical properties as indicated by a decreased percent change of the Dielectric Loss Index measured after exposure to 15 psig steam for 16 hours from the Dielectric Loss Index measured under dry conditions at 25° C.

2. The composition of claim 1 wherein said silica is a crystalline silica.

3. The composition of claim 1 wherein said filler is a fused silica.

4. The composition of claim 1 wherein said silica is a mixture of crystalline and fused silicas.

5. The composition of claim 1 wherein said filler is selected from the group consisting of calcined clay, antimony trioxide and mixtures thereof.

6. The composition of claim 1 wherein the combined amount of silica and additional filler is at least about 50 percent by weight of said composition.

7. The composition of claim 1 wherein about 0.2 to 0.5 percent by weight of silane coupling agent is present.

8. The composition of claim 7 wherein said silane is selected from the group consisting of vinyl-tris(beta-methoxyethoxy)silane, gamma-glycidoxypropytrimethoxy silane and mixtures thereof.

9. The composition of claim 1 wherein said lubricant is present in an amount of about 0.2 to 1 percent by weight.

10. The composition of claim 11 wherein said lubricant is selected from the group consisting of carnauba wax, montanic acid ester wax, polyethylene wax and mixtures thereof.

11. The composition of claim 1 wherein said epoxide compound is selected from the group consisting of epoxy novolac, diglycidyl ether of bisphenol A, polyglycidyl ethers of bisphenol A, brominated di- polyglycidyl ethers of bisphenol A and mixtures thereof.

12. The composition of claim 1 wherein said polyanhydride has a softening point of 111° to 156° C and is the reaction product of the mass polymerization of a maleic monomer and at least one alkyl styrene monomer in molar ratios of maleic to alkyl styrene monomer of greater than 1 to 1.

13. The composition of claim 1 wherein said prepolymer is formed from an epoxide compound having more than one 1,2-epoxy group and an epoxide equivalent of 75 to 500, said epoxide being present in an amount to provide from about 0.1 to 1.3 equivalents of epoxy per anhydride equivalent weight.

14. A semiconductor device encapsulated with a heat cured product of claim 1.

* * * * *

UNITED STATES PATENT AND TRADEMARK OFFICE
CERTIFICATE OF CORRECTION

PATENT NO. : 4,042,550
DATED : August 16, 1977
INVENTOR(S) : Harold W. Tuller

It is certified that error appears in the above-identified patent and that said Letters Patent are hereby corrected as shown below:

Column 2, line 24, "3,789,028" should read -- 3,789,038 --.

Column 5, line 2, "was" should read -- wax --.

Column 8, line 36, "550and" should read -- 550 and --.

Column 8, line 55, "174" should read -- 1/4 --.

Column 8, line 59, "LCE" should read -- "LCE" --.

Column 15, line 24, "285%" should read -- 2.85% --.

Column 15, line 37, "94-0" should read -- 94V-0 --.

Column 16, line 39, "11" should read -- 9 --.

Column 16, line 46, insert -- and -- after di-.

Column 16, line 57, insert -- sufficient -- after amount.

Signed and Sealed this

Thirtieth Day of May 1978

[SEAL]

Attest:

RUTH C. MASON
Attesting Officer

LUTRELLE F. PARKER
Acting Commissioner of Patents and Trademarks